US011183995B1

(12) United States Patent
Shelke et al.

(10) Patent No.: US 11,183,995 B1
(45) Date of Patent: Nov. 23, 2021

(54) HIGH-RESOLUTION DIGITALLY CONTROLLED DELAY LINE

(71) Applicant: Rambus Inc., Sunnyvale, CA (US)

(72) Inventors: Anirudha Shelke, Bangalore (IN); Navin Kumar Mishra, Bangalore (IN)

(73) Assignee: Rambus Inc., San Jose, CA (US)

( * ) Notice: Subject to any disclaimer, the term of this patent is extended or adjusted under 35 U.S.C. 154(b) by 0 days.

(21) Appl. No.: 15/945,523

(22) Filed: Apr. 4, 2018

Related U.S. Application Data (60) Provisional application No. 62/520,725, filed on Jun. 16, 2017.

(51) Int. Cl.
| | |
|---|---|
| *H03K 5/131* | (2014.01) |
| *H03K 5/133* | (2014.01) |
| *H03K 5/135* | (2006.01) |
| *H03K 5/00* | (2006.01) |
| *G11C 7/22* | (2006.01) |

(52) U.S. Cl.
CPC ............. *H03K 5/131* (2013.01); *G11C 7/22* (2013.01); *H03K 5/133* (2013.01); *H03K 5/135* (2013.01); *H03K 2005/00286* (2013.01)

(58) Field of Classification Search
CPC .......... H03K 5/131; H03K 5/133; H03K 5/14
See application file for complete search history.

(56) References Cited

U.S. PATENT DOCUMENTS

| | | | |
|---|---|---|---|
| 4,686,495 A | 8/1987 | Kameya | |
| 5,382,850 A | 1/1995 | Aldrich et al. | |
| 5,727,021 A * | 3/1998 | Truebenbach | G01R 31/3191 327/395 |
| 5,844,954 A | 12/1998 | Casasanta et al. | |
| 5,963,074 A | 10/1999 | Arkin | |
| 6,037,818 A | 3/2000 | Sato | |
| 6,046,620 A * | 4/2000 | Relph | H03K 5/133 327/277 |
| 6,166,573 A | 12/2000 | Moore et al. | |
| 6,327,318 B1 | 12/2001 | Bhullar et al. | |

(Continued)

OTHER PUBLICATIONS

Keeth, Brent, et al., "DRAM Circuit Design—Fundamental and High-Speed Topics", IEEE Press Series on Microelectronic Systems, Wiley-Interscience Publication 2008, Chapter 11, p. 266. 2 pages.

*Primary Examiner* — Lincoln D Donovan
*Assistant Examiner* — Colleen J O Toole
(74) *Attorney, Agent, or Firm* — Charles Shemwell (57) ABSTRACT

In a delay control circuit having a plurality of series-coupled delay stages, an input signal is routed through one of the series-coupled delay stages via a first delay element if a first delay control value is in a first state, the first delay element imposing a first signal propagation delay according to a first bias signal. If the delay control value is in a second state, the input signal is routed through the one of the series-coupled delay stages via a second delay element instead of the first delay element, the second delay element imposing a second signal propagation delay according to a second bias signal. The first and second bias signals are calibrated such that the second signal propagation delay exceeds the first propagation delay by a predetermined time interval that is substantially briefer than the first signal propagation delay.

20 Claims, 4 Drawing Sheets

(56) References Cited

U.S. PATENT DOCUMENTS

| | | |
|---|---|---|
| 6,415,402 B2 * | 7/2002 | Bishop ............. G01R 31/31937 327/18 |
| 6,421,784 B1 | 7/2002 | Chu et al. |
| 6,426,985 B1 | 7/2002 | Iwata et al. |
| 6,795,931 B1 | 9/2004 | LaBerge |
| 6,812,760 B1 | 11/2004 | Kim et al. |
| 7,072,433 B2 | 7/2006 | Bell |
| 7,088,159 B2 | 8/2006 | Kwak et al. |
| 7,109,774 B2 | 9/2006 | Kim |
| 7,170,331 B2 | 1/2007 | Shutoku et al. |
| 7,911,873 B1 | 3/2011 | Menon et al. |
| 7,948,287 B2 | 5/2011 | Oh et al. |
| 8,453,096 B2 | 5/2013 | Magee et al. |
| 8,547,153 B2 | 10/2013 | Jung et al. |
| 8,564,345 B2 | 10/2013 | Yu |
| 9,425,779 B2 | 8/2016 | Jung |
| 9,564,909 B1 | 2/2017 | Iorga et al. |
| 2007/0008023 A1 * | 1/2007 | Wang .................... H03K 5/133 327/276 |
| 2007/0096787 A1 | 5/2007 | Heightley |

* cited by examiner

HIGH-RESOLUTION DIGITALLY CONTROLLED DELAY LINE

CROSS REFERENCE TO RELATED APPLICATIONS

This application hereby claims priority to and incorporates by reference U.S. Provisional Application No. 62/520,725 filed Jun. 16, 2017.

TECHNICAL FIELD

The present disclosure relates to the field of precision timing in integrated circuit components and systems of integrated circuit components.

DRAWINGS

The various embodiments disclosed herein are illustrated by way of example, and not by way of limitation, in the figures of the accompanying drawings and in which like reference numerals refer to similar elements and in which.

DETAILED DESCRIPTION

In various embodiments disclosed herein, a delta delay stage implemented within a digitally controlled delay line includes at least two digitally selectable signal paths with propagation times controlled by respective bias signals calibrated to yield a target propagation time difference or "delta delay" (difference between the delay through one path and the delay through the other path) that is a fraction of the propagation time through either path alone. In a number of embodiments, two or more such delta delay stages are coupled in series within a delay line and implemented with binary-weighted delays (e.g., delta delay in a given stage is twice that of its predecessor/half that of its successor, or vice-versa) so that a multi-bit delay control value may be used to establish any propagation delay within a minimum-maximum range at a resolution according to the briefest delta delay. In other embodiments one or more delta delay stages are coupled in series with one or more absolute delay stages—delay stages in which only one of two digitally selectable alternative signal paths includes a bias-controlled propagation time (e.g., with the other path typically exhibiting merely a wire delay)—to implement a hybrid delay line having a delay range that extends beyond that of an individual bias-controlled path propagation time. In yet other embodiments, the delta delay stages of a hybrid delay line are calibrated to exhibit delta delays that are a power-of-two subdivision of the bias-controlled propagation time through an absolute delay stage. These and other features and embodiments are presented below in reference to the drawing figures.

Figure 1:
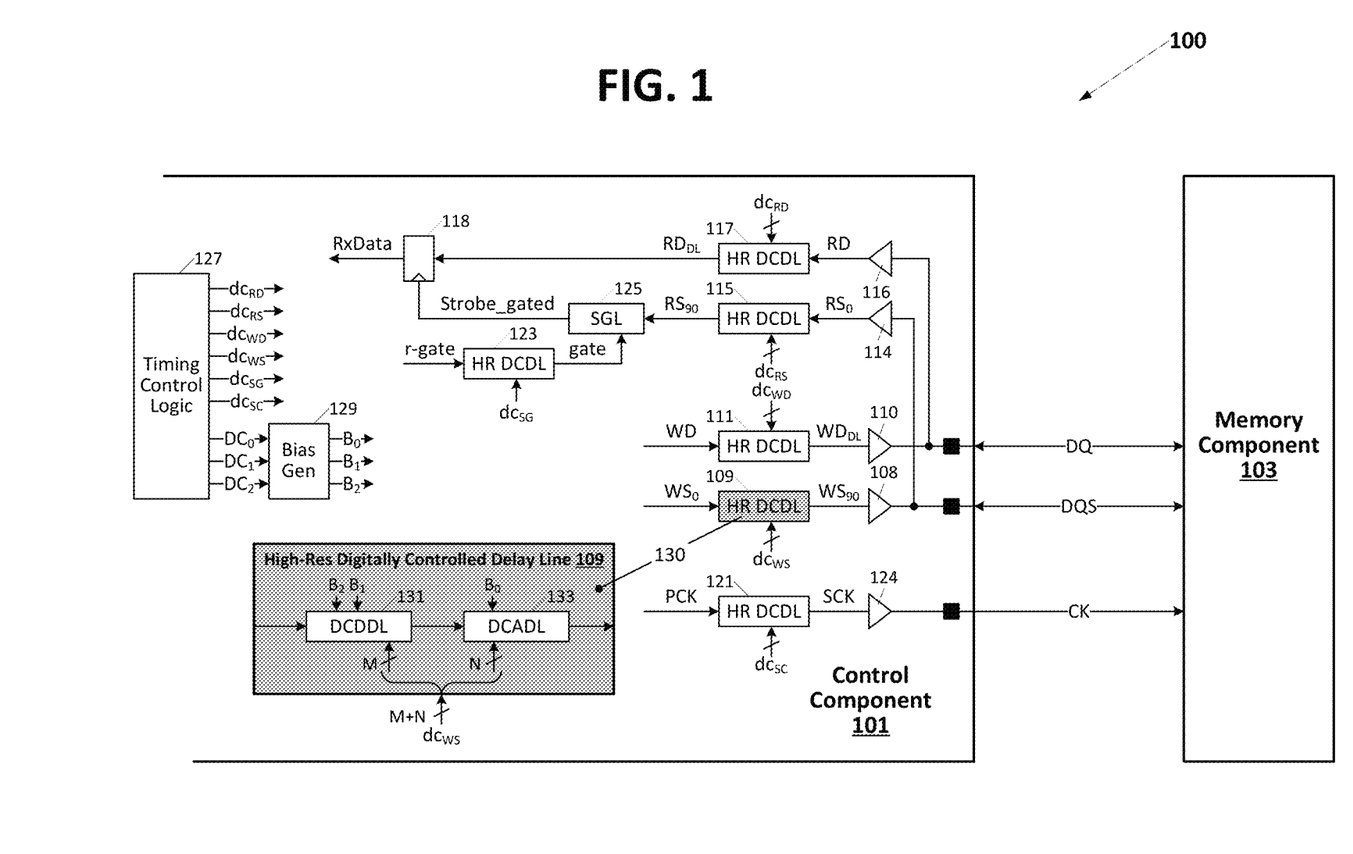
FIG. 1 illustrates an embodiment of a memory system in which high-resolution digitally controlled delay lines (HR DCDLs), each including at least one "delta" delay stage as discussed above, are used to implement precision timing control in transmitted/received signals and related control signals.

FIG. 1 illustrates an embodiment of a memory system 100 in which high-resolution digitally controlled delay lines (HR DCDLs), each including at least one delta delay stage as discussed above, are used to implement precision timing control in transmitted/received signals and related control signals. As shown, memory system 100 includes a control component 101 and memory component 103 coupled to one another through various signaling paths including, for example and without limitation, a data signaling link (DQ), strobe signaling link (DQS) and clock signaling link (CK). In the depicted implementation, the data signaling link is driven bidirectionally, conveying read data from memory component 103 to control component 101 in a memory read operation and conveying write data from control component 101 to memory component 103 in a memory write operation. The strobe signaling link is also driven bidirectionally, conveying a write strobe signal from the control component to the memory component and a read strobe signal from the memory component to the control component—both such strobe signals constituting timing signals that are applied within destination signaling interfaces (of control component 101 and memory component 103, respectively) to time data reception. Various details of memory system 100 may change in alternative embodiments (e.g., separate unidirectional data and/or strobe signaling paths may be provided for read and write data signals/data strobe signals; read and write clock signals may be conveyed instead of strobe signals; the system clock may be supplied to the memory component from a source other than the control component, etc.), signal driver/conditioning circuits (108, 110, 14, 116, 124) may be relocated or merged with data sampling/sourcing circuits, and various other unshown signaling links and related interface circuitry may be present (e.g., command/address signaling link and interface circuitry within control component 101 and memory component 103 therefor). More generally, the depicted high-resolution DCDLs (109, 111, 115, 117, 121, 123) or variations thereof may be applied in chip-to-chip signaling systems other than memory systems and/or high-precision phase/timing adjustment applications other than those required in chip-to-chip signaling applications.

To ensure maximum timing margin within signal sampling circuitry of control component 101 (e.g., receive data sampler 118) and memory component 103, relative timing between strobe and data signals (i.e., write data/write data strobe and read data/read data strobe) is calibrated at system startup by adjusting relative propagation delays imparted to those signals within pertinent high-resolution digitally controlled delay lines—that is delay lines 109 and 111 in the write data timing path and delay lines 115 and 117 in the read timing path, both of which are implemented within control component 101 in the embodiment shown. In the clock forwarding embodiment shown, another high-resolution digitally controlled delay line 121 is provided to enable high-resolution phase adjustment of a clock signal (SCK) forwarded to the memory component via clock link CK and thus align the memory-component timing domain established by the forwarded clock with command/address arrival (over links not shown), write strobe arrival, etc. Yet another high-resolution DCDL 123 is provided to delay a control signal ("r-gate") as necessary to deliver a strobe gating signal ("gate") to strobe-gating logic 125 with a desired phase (timing offset) with respect to an incoming read strobe signal (RS0) and phase-adjusted, quadrature version thereof (RS90). Though this quadrature timing relation is assumed in various embodiments presented herein with respect to both read and write timing, other timing relationships between incoming/outgoing timing signals (strobe, clock, etc.) and data signals may be implemented in alternative embodiments. Also, even in the case of a nominally quadrature timing relationship, data and strobe signals may not be offset by exactly 90° under optimal timing arrangements.

With respect to the high resolution DCDLs applied for strobe/data signal timing alignment, at least (i.e., HR DCDLs 109/111 and 115/117), a quadrature phase delay may be implemented in addition to the fine (high-resolution) delay to yield a quadrature arrangement between the corresponding read or write data waveform—that is, alignment of strobe signal edges at the data-eye midpoint. For example, in addition to enabling precision timing alignment between write data signal $WD_{DL}$ and write strobe signal $WS_{90}$, write path delay lines 109 and/or 111 may additional impart a half-bit time delay in the write strobe path relative to the write data path such that nominal edge-alignment between incoming write data and write strobe signals (WD and $WS_0$) is converted to a quadrature alignment between delayed write data signal $WD_{DL}$ and delayed write strobe signal $WS_{90}$. Similarly, in addition to enabling precision timing alignment between read data signal $RD_{DL}$ and read strobe signal $RS_{90}$, read path delay lines 115 and/or 117 may additional impart a half-bit time delay in the read strobe path relative to the read data path such that nominal edge-alignment between incoming read data and read strobe signals (RD and $RS_0$) is converted to a quadrature alignment between delayed read data signal $RD_{DL}$ and delayed read strobe signal $RS_{90}$. In all cases, non-quadrature strobe-to-data timing offsets may apply, as mentioned above.

Still referring to FIG. 1, each of the high-resolution digitally controlled delay lines (109, 111, 115, 117, 121, 123) receives a respective delay control word ($dc_{WS}$, $dc_{WD}$, $dc_{RS}$, $dc_{RD}$, $dc_{SC}$, $dc_{SG}$) from a timing control logic circuit 125. Though not specifically shown, timing controller 127 is coupled to receive other signals that may be phase compared or otherwise evaluated (e.g., signals to be phase aligned, signals that reflect error rates, etc.) to produce up/down adjustments in each of the delay control words, thus effecting a closed-loop timing calibration for each signal propagating through a given high-resolution DCDL. Also, as discussed in greater detail below, timing controller 127 may output DAC (digital-to-analog converter) control values ($DC_0$, $DC_1$, $DC_2$) to bias generator 129 which, in turn, generates corresponding bias voltages or currents ($B_0$, $B_1$, $B_2$) as necessary to implement desired delays within bias-controlled delay elements of each high-resolution DCDL.

While delay range and resolution may vary from one high-resolution DCDL implementation to the next (even within the same system or component), each of the HR DCDLs shown in FIG. 1 and embodiments discussed below is assumed to be a hybrid DCDL as shown in detail view 130—containing both a digitally-controlled delta delay line (DCDDL) having M delta delay stages, and a digitally-controlled absolute delay line (DCADL) having N absolute delay stages. In the particular implementation shown in FIG. 1, delay through component delay stages of absolute delay line 133 is established by a bias signal (voltage or current) B0, and the delta delay through component delay stages of delta delay line 131 is established by bias signals B1 and B2. In alternative embodiments, one of the bias signals supplied to the delta delay stages may also be supplied to the absolute delay stages of the DCADL so that only two different bias signals need be generated (with those two signals may be replicated as necessary to meet fan-out/loading constraints). Also, in all disclosed embodiments total delay-stage count and relative numbers of delta and absolute delay stages within delay lines 131 and 133 may vary and absolute delay stages may be omitted altogether (i.e., DCADL 133 omitted). Nor must the bias signals supplied to different high-resolution DCDLs be uniform in all embodiments. Further, while binary-weighted delay stages are described in embodiments below (i.e., to yield linear incremental delay steps across the delay range), other delay weighting schemes may be employed in alternative embodiments, including arrangements that yield non-linear delay increments as the digital control value is sequenced from minimum to maximum delay settings.

Figure 2:
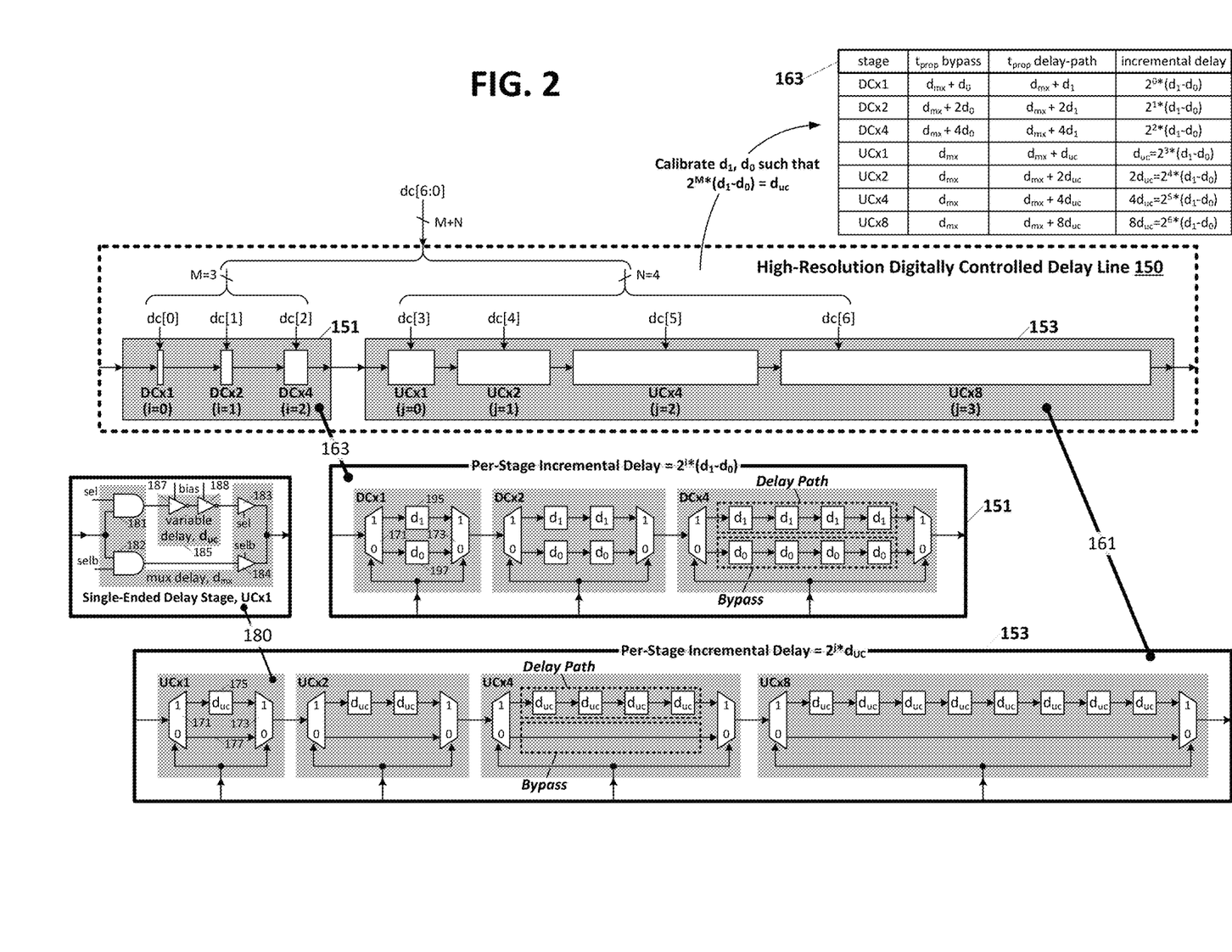
FIG. 2 illustrates a more detailed embodiment of a high-resolution digitally controlled delay line having a multi-stage digitally-controlled delta delay line coupled in series with a multi-stage digitally controlled absolute delay line.

FIG. 2 illustrates a more detailed embodiment of a high-resolution digitally controlled delay line 150 ("HR delay line") having a multi-stage digitally-controlled delta delay line 151 (the "delta delay line") coupled in series with a multi-stage digitally controlled absolute delay line 153 (the "absolute delay line"). Delta delay line stages DCx1, DCx2 and DCx4 are controlled, respectively, by the M least significant bits of delay control value "dc" and absolute delay line stages UCx1, UCx2, UCx4, UCx8 are controlled by the N most significant delay control bits, with each delay stage in the collective set contributing a binary weighted incremental delay established by the propagation time difference between longer and lesser delayed signal paths within that stage. Accordingly, in the seven stage HR delay line example shown in which M=3 and N=4 (stage counts carried forward in examples below, but that may be different in all cases), $2^{M+N}=2^7=128$ different delay values may be selected, with a linear incremental delay step between numerically successive delay control values (i.e., the "delay resolution") established by the propagation time difference through alternative signal paths within delta delay stage DCx1—a time interval referred to herein as the delta cell delay.

Still referring to FIG. 2, and more specifically to the detail view 161 of absolute delay line 153, each of the constituent absolute delay stages (UCx1, UCx2, UCx4, UCx8) includes multiplexing elements 171/173 for routing an arriving signal from delay-stage input to delay-stage output via one of two alternative signal paths according to a delay control bit (i.e., given bit of dc[M+N]). More specifically, as shown in absolute delay stage UCx1, multiplexing elements 171 and 173 respond to the state of the incoming delay control bit (e.g., a logic '1' or '0') by conducting the incoming signal through either (i) a "delay path" that includes one or more "unit cell" delay elements 175, each having a bias-controlled (variable) delay, $d_{UC}$, or (ii) a "bypass path" implemented by a direct wired connection 177 between multiplexing elements 171 and 173, and thus a nominally zero propagation delay. Because, the delay path of each successive absolute delay stage (UCx2, UCx4, UCx8) includes a binary-weighted number of unit-cell delay elements coupled in series, those stages impart binary weighted (power-of-two) multiplex of the unit cell delay—that is unit cell delay ×2, ×4 or ×8, respectively. Also, while the multiplexing structure in each stage (conceptually shown by elements 171 and 173 in UCx1) imparts a finite delay $d_{mx}$, that delay is common to the alternative signal propagation paths (i.e., incurred regardless of whether the signal of interest is propagated through the delay path or bypass path), so that the incremental delay effected by switching the subject delay control bit for a given absolute delay stage from '1' to '0' or vice-versa corresponds to the binary-weighted unit cell delay of that stage. Accordingly, absolute delay line 153 imparts a collective incremental delay ranging from 0 to $d_{UC}*2^{N-1}$ ('*'denoting multiplication) in unit cell delay steps, $d_{UC}$, and in accordance with the most significant N bits of the delay control value.

Referring to the particular embodiment of absolute delay stage UCx1 shown in detail view 180, input and output multiplexing elements 171 and 173 are implemented, respectively, by AND gate pair 181/182 and tri-state buffer pair 183/184, with the constituent elements of each pair driven by complementary instances of the incoming delay control bit (shown as "sel" and "selb"). While this structure/circuit arrangement is assumed in various embodiments discussed below, other multiplexing circuits may be deployed in alternative embodiments.

Still referring the detail view 180 of absolute delay stage UCx1, the briefest achievable propagation time difference between the delay path and bypass path (i.e., minimal incremental delay) is constrained by minimum achievable unit cell delay and thus by the switching speed of active components within variable delay element 185—that is, by the bias-controlled switching speed of series coupled inverters 187 and 188 in the embodiment shown (e.g., where the bias voltage ("bias") represents the supply voltage to the inverters in a current-starved implementation). This minimum absolute delay resolution, $t_{min}$, while sufficient for many applications, yields an increasingly problematic quantization error (and linearity error) as signaling rates increase and data-eye timing budgets shrink.

Delta delay line 151 overcomes the absolute delay resolution constraint by implementing bias-controlled propagation delays in each of the alternative signal propagation paths of a given stage, calibrating those alternative propagation delays to yield a propagation time difference (i.e., incremental delay) that is a fraction of the propagation delay through either alternative path alone—an exceedingly brief delay limited only by practicable delay bias resolution.

In one embodiment, binary weighted delta delays are achieved by doubling the number of series-coupled delay elements in each successive delay stage (DCx1, DCx2, DCx4, . . . ) of delta delay line 151. Referring to detail view 163, for example, a minimal delta delay—referred to herein as a delta cell delay—is implemented within stage DCx1 by providing slightly different bias control values to variable delay elements 195 and 197 traversed by the delay path and bypass path, respectively, thus yielding a slightly higher propagation delay $d_1$ through delay element 195 than the propagation delay $d_0$ through delay element 197. As one propagation path or the other is selected by input/output multiplexing elements 171/173, the propagation time difference or incremental delay (i.e., delta cell delay in stage DCx1) is $d_1-d_0$. By doubling the number of $d_1$ elements and $d_0$ elements in respective alternative paths of the ensuing delta delay stages (i.e., $2d_1$ and $2d_0$ in stage DCx2, $4d_1$ and $4d_0$ in stage DCx4, etc.), binary weighted incremental delays are achieved from stage to stage. Further, by calibrating $d_1$ and $d_0$ such that delta cell delay ($d_1-d_0$) is equal to the unit cell delay divided by $2^M$ (i.e., $2^{M}*(d_1-d_0)=d_{UC}$), a binary-weighted delay continuum is achieved across the constituent stages of the HR DCDL as a whole. That is, the incremental delay of absolute delay stage UCx1 (i.e., unit cell delay, $d_{UC}$) is $2^M$ times the incremental delay of delta delay stage DCx1, $2^{M-1}$ times the incremental delay of delta delay stage DCx2 and $2^{M-2}$ (or two times in this M=3 example) the incremental delay of delta delay stage DCx4. These incremental delays for individual delay stages of HR delay line 150 are tabulated at 163 together with the propagation times through the alternative signal propagation paths (i.e., bypass path and delay path) within each delay stage.

Figure 3A:
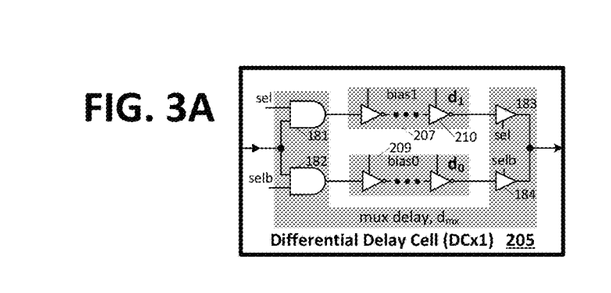
FIG. 3A illustrates an exemplary implementation of delta delay stage DCx1 having alternatively selectable bias-controlled signal propagation paths.

FIG. 3A illustrates an exemplary implementation of delta delay stage DCx1 (205) having a multiplexing structure implemented as discussed above (i.e., by AND gates 181/182 and tri-state buffers 183/184) and having alternatively selectable signal propagation paths—delay path 207 and bypass path 209. In the depicted embodiment, the alternative signal propagation path delays are effected by one or more series-coupled inverter elements 210 (generally implemented in pairs to avoid signal inversion), with each inverter in delay path 207 biased by signal "bias1" to implement delay $d_1$, and each inverter in bypass path 209 biased by signal "bias0" to implement delay $d_0$. In general, a uniform number of inverters 210 is provided in each of the two signal propagation paths, though non-uniform numbers of inverters may be used in alternative embodiments. While each of the delay path 207 and bypass path 209 is generally constituted by an even number of chained inverter elements 210 to avoid signal inversion, an odd number of inverter elements may be implemented (e.g., 1, 3, 5, . . . ) where signal inversion is desired or tolerable (e.g., tolerable in view of like inversion of related signal in another high-resolution DCDL).

Figure 3B:
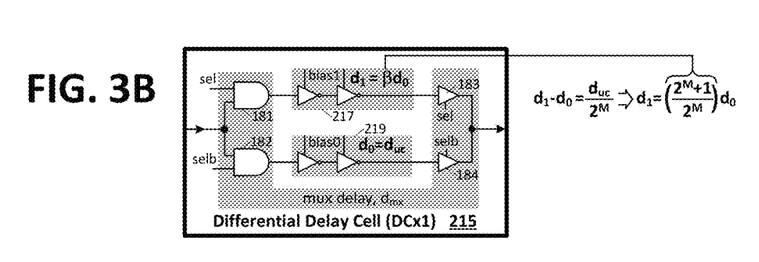
FIG. 3B illustrates a more specific implementation of delta delay stage DCx1 (215), in this case having the same multiplexing structure as in FIG. 3A, but with the number of inverter stages within each signal propagation path (delay path and bypass path) fixed at two as in the delay path implementation of a unit delay cell.

FIG. 3B illustrates a more specific implementation of delta delay stage DCx1 (215), in this case having the same multiplexing structure as in FIG. 3A, but with the number of inverter stages within each signal propagation path (delay path 217 and bypass path 219) fixed at two to match the delay path implementation of a unit delay cell. Further, the bypass path delay is set to match the unit delay cell (e.g., by supplying the same bias0 signal or signal level to the delay elements within the delay paths of absolute delay stages and also to the delay elements within the bypass paths of delta delay stages) so that $d_0=d_{UC}$ and, in accordance with binary weighting constraint $d_1-d_0=d_{UC}/2^M$, so that $d_1=((2^M+1)/2^M)*d0$, where $(2^M+1)/2^M$ constitutes a delta bias factor, $\beta$.

Figure 4:
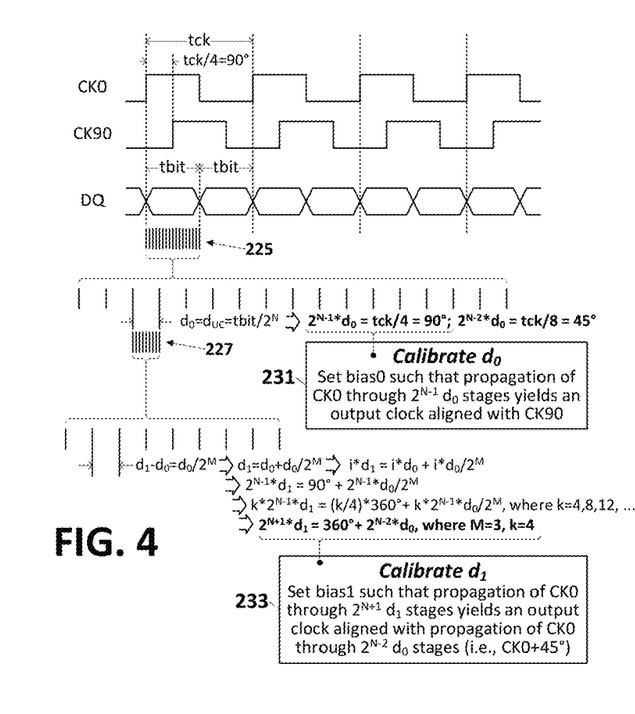
FIG. 4 illustrates an exemplary calibration sequence executed to map the linearly-divisible delay range of a high-resolution DCDL onto a time interval of interest

FIG. 4 illustrates an exemplary calibration sequence executed to map the linearly-divisible delay range of a high-resolution DCDL onto a time interval of interest—in this case a bit-time (tbit) in a double-data-rate (DDR) strobe-timed data transmission as may be implemented in system 100 of FIG. 1. As discussed below, the delay range may span larger or smaller time intervals of interest (e.g., whole clock cycle, tck) in alternative embodiments. Also, for purposes of example only, quadrature clocks CK0 and CK90 are assumed to be generated within or supplied to the host integrated circuit component (e.g., the control component shown in FIG. 1), with each such clock cycling at half the bit rate (i.e., clock period=tck=2*tbit). To establish a high-resolution digitally controlled delay line (e.g., as discussed above) as a timing vernier that spans the bit time in substantially equal (linear) delay steps, the bypass path propagation delay of the delta delay cell ($d_0$) is biased to match the unit cell delay path propagation time (i.e., $d_0 = d_{UC}$), which, in turn, is calibrated to subdivide the bit time (tck/2) into $2^N$ time intervals as shown at 225 (with the value of N constrained such that $d_{UC} \geq t_{MIN}$). In the embodiment shown, this calibration is achieved by leveraging the tck/4 (i.e., 90°) phase offset between quadrature clocks CK0 and CK90; a tbit/2 time interval to be spanned by $2^{N-1}$ unit cell delay intervals. Accordingly, as shown at 231, the $d_0$ bias signal, bias0, is adjusted until propagation of clock CK0 through $2^{N-1}$ unit cell delay elements yields an output clock aligned with CK90.

Turning to delta cell delay calibration, the unit cell delay is to be further subdivided into $2^M$ delta cell delay intervals (d1–d0) as shown at 227, meaning that propagation of a clock signal through a given number ('i') of $d_1$ delay elements should yield a delay equal to $i*d_0 + i*d_0/2^M$. Moreover, because $2^{N-1}*d_0$ has already been calibrated to yield a 90° delay, it follows that the '$i*d_0$' may be rendered to a full-cycle delay (and thus eliminated from consideration in a calibration using periodic clocks) by setting $i = k*2^{N-1}$, where k=4, 8, 12, . . . . Accordingly, in one embodiment, value of k is chosen according to available reference clock phases in view of the delay line resolution to be achieved (i.e., values of 'M' and 'N'). For example, in the M=3, N=4 embodiments discussed thus far, setting k to 4 yields the $d_1$ calibration approach shown at 233 in which the $d_1$ bias signal, bias1, is set such that propagation of CK0 through $2^{N+1}$ $d_1$ delay elements (i.e., $4*2^{N-1}$) yields an output clock phase that is delayed from CK0 by $360° + 2^{N-2}*d_0$. Because the whole-cycle delay (360°) may be omitted, the output clock from the $2^{N+1}$ $d_1$ delay stages is adjustment for phase alignment with propagation of CK0 through $2^{N-2}$ $d_0$ delay stages, where $2^{N-2}$ is half the number of $d_0$ stages applied to calibrate bias0 (i.e., impart a 90° delay) and thus corresponds to a 45° delay. Said another way, a chain of bias0-controlled $d_0$ delay elements sized to yield a whole tck delay (i.e., $k*2^{N-1}$ delay elements, where k=4, 8, 12, etc.) should yield that same delay + $360°/2^M$ when controlled by bias1. Letting M=3 in this example (higher values of M may be used, up to the practical limit of bias signal resolution), then bias1 should be set such the propagation time through $k*2^{N-1}$ $d_1$ delay elements yield an extra 45° delay per tck delay (i.e., k/4) relative to the propagation time through the same number of $d_0$ delay elements. As shown at 233, this calibration point may be achieved in a k=4 example by setting bias1 such that propagation of CK0 through $2^{N+1}$ $d_1$ delay elements yields an output clock aligned with propagation of that same clock (CK0) through a 45° delay path (i.e., half the 90° delay path and thus $2^{N-2}$ $d_0$ elements).

Figure 5:
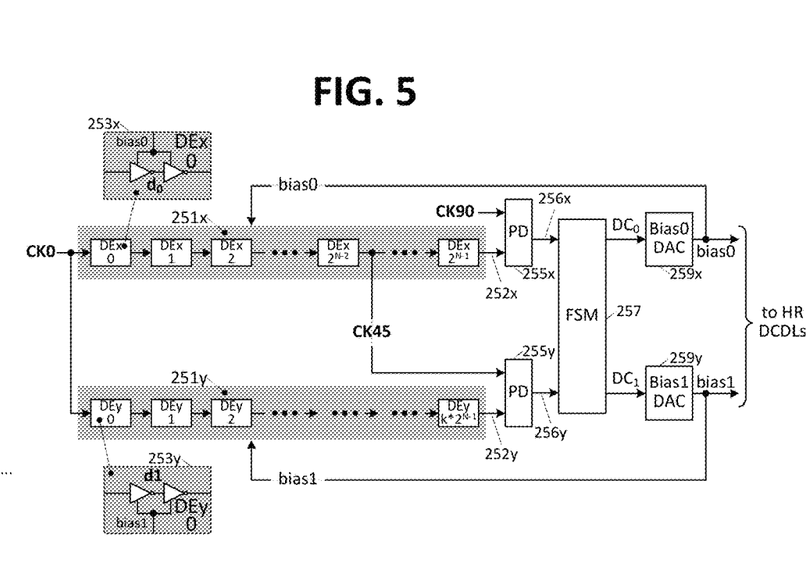
FIG. 5 illustrates an embodiment of a delay calibration circuit that executes a two-phase calibration operation to yield the $d_0$ and $d_1$ bias points described in reference to FIG. 4.

FIG. 5 illustrates an embodiment of a delay calibration circuit that executes a two-phase calibration operation to yield the $d_0$ and $d_1$ bias points described in reference to FIG. 4. In the first calibration phase, a delay line 251x containing $2^{N-1}$ series-coupled unit cell ($d_0$) delay elements (DEx[0]-DEx[$2^{N-1}$]) generates, as an output clock 252x, a 90°-delayed version (nominally) of zero-phase clock signal, CK0. Phase detector 255x compares the phases of output clock 252x and CK90 (a reference clock delayed by 90° relative to CK0), generating a delay-adjust signal 256x in an increase or decrease state (+/−) according to whether output clock 252x leads or lags CK90, respectively. Finite state machine 257 ("FSM") responds to the delay-adjust signal by increasing or reducing $DC_0$, a digital value supplied to DAC 259x (digital-to-analog converter) to control generation of bias0 and, by extension, the propagation delay through delay line 251x. Thus, when output clock 252x leads CK90 (i.e., propagation delay through delay line 251x is less than tck/4 and thus less than 90°), phase detector 255x asserts delay-adjust+, causing FSM 257 to lower $DC_0$ and correspondingly lower the bias0 output from DAC 259x. The lowered bias0 signal increases the propagation delay through delay line 251x (e.g., by slowing the output slew rate of component inverters within delay elements DEx all of which are implemented as unit cells as shown in exemplary detail view 253x) to reduce the phase lead and thus drive output clock 252x toward phase alignment with CK90. Conversely, when output clock 252x lags CK90 (i.e., propagation delay through delay line 251x is greater than 90°), phase detector 255x asserts delay-adjust- to cause FSM 257 to raise $DC_0$ and correspondingly raise the bias0 output from DAC 259x—an operation that reduces the propagation delay through constituent delay elements of delay line 251x and thus reduces the output clock phase lag. By iteratively adjusting the bias0 signal up and/or down until a convergence point is reached (e.g., dithering $DC_0$ value) is reached, the bias0 level is calibrated to yield the tbit/$2^N$ unit cell delay time discussed in FIG. 4. As shown, the calibrated bias0 signal is distributed to one or more HR digitally controlled delay lines (with replication as necessary to meet fan-out/loading requirements) to bias the $d_0$ delay elements therein.

Still referring to FIG. 5, in the second calibration phase, a delay line 251y containing $k*2^{N-1}$ series-coupled d1 delay elements generates an output clock 252y nominally delayed by k/4 full clock cycles plus $(k/4)*360°/2^M$ relative to input reference clock, CK0, where k is a multiple of 4 to enable the full clock cycles (i.e., tck intervals) to be disregarded (i.e., CK0 is phase aligned with $CK0+(k/4)*360°$ by virtue of periodicity). Following the examples discussed thus far in which k=4 and M=3, delay line 252y yields an output clock nominally delayed by a full tck interval (360°) plus 45° and thus an output clock aligned with the propagation of CK0 through $2^{N-2}$ d0 stages—a 45° reference clock (CK45) obtained in this example from the center delay element DEx[$2^{N-2}$] in delay line 251x. Phase detector 255y compares the phases of output clock 252y and CK45 to generate a delay-adjust signal 256y in an increase/decrease (+/−) state according to whether output clock 252y leads or lags CK45, respectively. Finite state machine 257 responds to delay-adjust signal 256y by increasing/reducing $DC_1$, a digital value supplied to DAC 259y to control generation of bias1 and, by extension, the propagation delay through delay line 251y. Thus, when output clock 252y leads CK45 (i.e., propagation delay through delay line 251y is less than tck/8 and thus less than) 45°, phase detector 255y asserts delay-adjust+, causing FSM 257 to lower $DC_1$ and correspondingly lower the bias1 signal output from DAC 259y. The lowered bias1 signal increases the propagation delay through delay line 251y (e.g., by slowing the output slew rate of component inverters within delay elements DEy all of which are implemented as shown in exemplary detail view 253y) to reduce the phase lead and thus drive output clock 252y toward phase alignment with CK45. Conversely, when output clock 252y lags CK45 (i.e., propagation delay through delay line is greater than 45°), phase detector 255y asserts delay-adjust- to cause FSM 257 to raise $DC_1$ and correspondingly raise the bias1 signal output from DAC 259y—an operation that reduces the propagation delay through delay line 251y and thus reduces the output clock phase lag. By iteratively adjusting the bias1 signal up and/or down until a convergence point is reached, the bias1 signal level is calibrated to yield the delta delay $d_1-d_0=d_0/2^M=$tbit/$2^{N+M}$ discussed in reference to FIG. 4. As shown, the calibrated bias1 signal is distributed to one or more HR digitally controlled delay lines (with replication as necessary to meet fan-out/loading requirements) to bias the $d_1$ delay elements therein.

Figure 6:
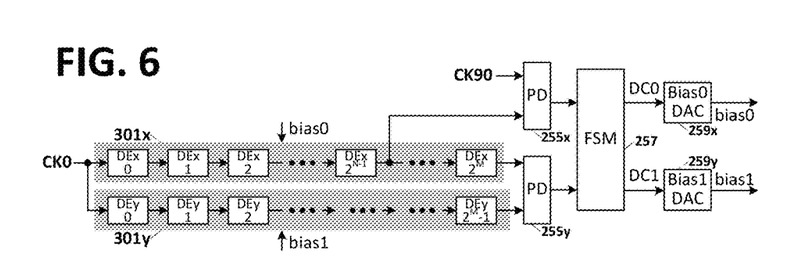
FIG. 6 illustrates an alternative calibration circuit that works generally as described in reference to FIG. 5, but with different numbers of $d_0$ delay elements and/or $2^M$ $d_1$ delay elements within respective calibration delay lines.

Reflecting on FIGS. 4 and 5, the depicted calibration operations and implementing circuitry may be varied in numerous regards. For example, while FIGS. 4 and 5 resolve a tbit delay range into $2^{M+N}$ delay steps (i.e., DCDL resolution=tbit/$2^{M+N}$), longer or shorter delay ranges may be so resolved in alternative embodiments. For example, the delay range may extend to a full tck interval, thus enabling a high-resolution DCDL to be deployed with a register-based delay circuit that enables delays of one or more whole clock cycles—effectively extending the delay range to two or more clock cycles with a delay resolution according to tck/$2^{M+N}$. Alternatively, the delay range may be limited to a fraction of the tbit interval (e.g., 50%, 60%, 70% etc. of tbit according to signaling margin). Also, while particular calibration delay line lengths are chosen in accordance with availability of particular reference clock signals in the embodiment of FIG. 5, delay lines of various other lengths may be used to yield the desired $d_0$, $d_1$ timing relationships. For example, FIG. 6 illustrates an alternative calibration circuit that works generally as described in reference to FIG. 5, except that delay lines 301$x$ and 301$y$ include $2^M+1$ $d_0$ delay elements and $2^M$ $d_1$ delay elements, respectively, thus enabling $d_1-d_0$ calibration according to the relation $d_1*2^M=d_0*(2^M+1)$. The precise tap point for the $d_0*2^{N-1}$ delay (to be compared with CK90 in phase detector 255$x$) may appear before or after the $2^M+1$ delay element in the delay chain, depending on the relation between N and M. In yet other embodiments, output clocks 252$x$ and 252$y$ are set by design to ensure that they lead their respective reference clocks, so that their respective bias points are always adjusted to increase delay through calibration delay lines 251$x$ and 251$y$ until a dithering point is reached.

Figure 7:
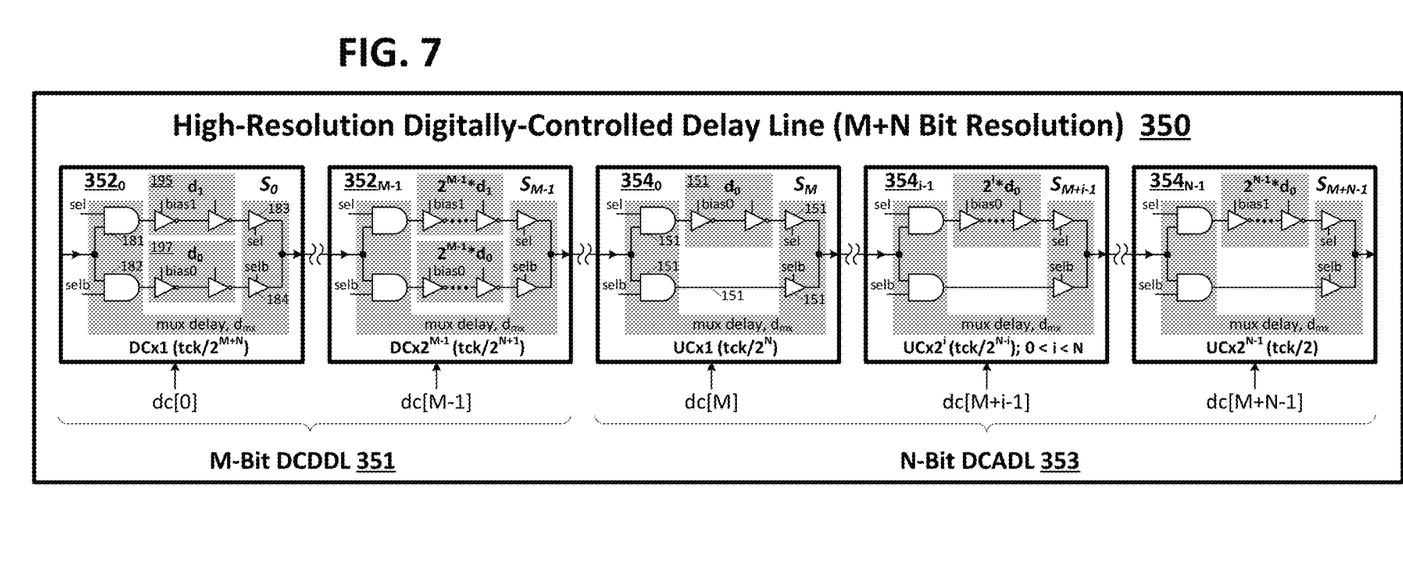
FIG. 7 illustrates an embodiment of a high-resolution digitally controlled delay line having generalized numbers (M and N, respectively) of delta delay stages and absolute delay stages coupled in series between delay line input and output.

FIG. 7 illustrates an embodiment of a high-resolution digitally controlled delay line 350 having generalized numbers (M and N, respectively) of delta delay stages and absolute delay stages coupled in series between delay line input and output. In the particular example shown, the delay range spans a full clock cycle (tck), subdividing that interval into $2^{M+N}$ delay steps (i.e., resolution=tck/$2^{M+N}$) that are substantially briefer (e.g., approaching a factor of $\frac{1}{2}^M$) than the minimal unit cell delay, $t_{min}$. The incremental delay (i.e., propagation time difference between delay path and bypass path) imparted by each delay stage within the M-bit delta delay line 351 and the N-bit absolute delay line 353 (i.e., delay stages 352$_0$-352$_{M-1}$ and 354$_0$-354$_{N-1}$, respectively) is shown in parentheses adjacent the delay stage moniker (i.e., delay stage DCx1 imparts a tck/$2^{M+N}$ incremental delay, while delay stage UCx$2^{N-1}$ imparts a tck/2 incremental delay). All stages include a multiplexing structure implemented generally as discussed in reference to FIG. 2 (alternative multiplexing arrangements may be implemented), and include numbers of bias-controlled delay elements ($d_1$ and $d_0$) as shown. More specifically, delta delay stages 352$_0$-352$_{M-1}$ include binary weighted numbers of $d_1$ elements and $d_0$ elements in the delay and bypass paths, respectively, to yield binary incremental delays of $2^0*(d_1-d_0)$, $2^1*(d_1-d_0)$, ..., $2^{M-1}*(d_1-d_0)$, respectively. By contrast, absolute delay stages 354$_0$-354$_{N-1}$ include binary weighted numbers of bias-controlled delay elements ($d_0$) in the delay-path only, with no bias-controlled delay elements in the bypass path (only wire delay) to yield incremental delays of $2^0*d_0$, $2^1*d_0$, ... $2^{N-1}*d_0$, respectively.

Reflecting on the various high-resolution DCDLs disclosed herein, it can be seen that the high-resolution achieved by the delta delay stages comes with an increased bypass path delay ("base delay") and thus an increased minimal latency from signal input to output. Where a given high-resolution DCDL is applied to yield fine-grained phase control in a periodic signal such as the system clock (SCK) shown in FIG. 1, the increased latency will generally be negligible within a delay line that otherwise subdivides the entire clock cycle as any whole cycle delay may be disregarded. Moreover, where the high-resolution DCDL is applied to provide fine timing adjustment of non-periodic control signals such as those shown in FIG. 1 (delaying r-gate to yield gate in a desired phase), the incoming signal of interest (signal to be delayed) may be advanced by whole (or half or quarter) clock cycles to cancel undesired latency in the delayed output signal. Finally, where two non-periodic signals are to be phase adjusted relative to one another as in the case of the write data and write strobe signals (or incoming read data and read strobe signals) shown in FIG. 1, the base propagation delay (i.e., multiplexing delay plus bypass path delay) is incurred in both signal paths and thus canceled with respect to their relative timing. Any absolute base delay in both signals may be compensated through whole cycle advance of both input signals. Referring to FIG. 1, for example, if the write-strobe/write-data HR DCDLs 109 and 111 each impart a whole clock cycle base delay, the incoming write strobe and write data signals may be supplied one clock cycle early to HR DCDLs 109 and 111, respectively. Further, while delta delay stage embodiments have been depicted as having two alternative signal paths per stage, the number of signal paths may in a given stage may be increased to reduce multiplexing latency. Referring to FIG. 7, for example, the bypass and delay paths in successive delta delay stages (e.g., 352$_0$ and its successor) may be combined within a single delta delay stage such that four alternative signal propagation paths may be traversed ($d_0+2d_0$, $d_1+2d_0$, $d_0+2d_1$ or $d_1+2d_1$) within a single stage—a number extendible to any practicable limit.

The various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits can be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any specific circuits, devices and the like can be different from those described above in alternative embodiments. Additionally, links or other interconnection between integrated circuit devices or internal circuit elements or blocks may be shown as buses or as single signal lines. Each of the buses can alternatively be a single signal line, and each of the single signal lines can alternatively be buses. Signals and signaling links, however shown or described, can be single-ended or differential. Signals shown as having active-high assertion or "true" states, may have opposite assertion states in alternative implementations. A signal driving circuit is said to "output" a signal to a signal receiving circuit when the signal driving circuit asserts (or de-asserts, if explicitly stated or indicated by context) the signal on a signal line coupled between the signal driving and signal receiving circuits. The term "coupled" is used herein to express a direct connection as well as a connection through one or more intervening circuits or structures. Integrated circuit device "programming" can include, for example and without limitation, loading a control value into a register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. A delay control circuit comprising:
   a control input to receive a digital control value; and
   a plurality of delay stages coupled in series between an input and output of the delay control circuit, with each delay stage receiving a respective bit of the digital control value and one of the delay stages including:
   a first delay element that imposes a first signal propagation delay according to a first bias signal;
   a second delay element that imposes a second signal propagation delay according to a second bias signal; and
   multiplexing circuitry to route a signal through the one of the delay stages via either the first delay element or the second delay element in accordance with the respective bit of the digital control value received within the one of the delay stages; and
   a calibration circuit to calibrate the first and second bias signals such that a nonzero time difference between the first and second signal propagation delays matches a predetermined time interval substantially briefer than either of the first and second signal propagation delays.

2. The delay control circuit of claim 1 wherein each of the first and second delay elements comprises a respective set of one or more inverter circuits coupled in series.

3. The delay control circuit of claim 1 wherein each of the first and second delay elements comprises a respective set of two inverters coupled in series, and wherein the second signal propagation delay exceeds the first signal propagation delay by a time interval less than a minimal time required for signal propagation through the two inverters coupled in series in either respective set.

4. The delay control circuit of claim 1 wherein at least one other of the delay stages comprises:
   a third delay element that imposes the first signal propagation delay according to the first bias signal;
   an alternative signal propagation path that lacks a bias-controlled delay element; and
   multiplexing circuitry to route a signal through the at least one other of the delay stages via either the third delay element or the alternative signal propagation path in accordance with the respective bit of the digital control value received within the at least one other of the delay stages.

5. The delay control circuit of claim 1 wherein the time difference between the first and second signal propagation delays is not more than half the first signal propagation delay.

6. The delay control circuit of claim 1 wherein the calibration circuit to calibrate the first and second bias signals such that the time difference between the first and second propagation delays matches the predetermined time interval comprises circuitry to calibrate the first and second bias signals such that the time difference between the first and second propagation delays nominally matches the first signal propagation delay divided by $2^M$, where M is integer greater than or equal to one.

7. The delay control circuit of claim 6 wherein the calibration circuit comprises:
   inputs to receive first and second clock signals having a predetermined first phase offset;
   a first delay line having a predetermined number of series-coupled delay elements each implemented identically to the first delay element and imposing a respective signal propagation delay according to the first bias signal; and
   bias adjustment circuitry to iteratively adjust the first bias signal until a signal propagation delay through the first delay line matches the first phase offset.

8. The delay control circuit of claim of claim 7 wherein the calibration circuit further comprises a second delay line having a predetermined number of series-coupled delay elements each implemented identically to the second delay element and imposing a respective signal propagation delay according to the second bias signal, and wherein the bias adjustment circuitry includes circuitry to iteratively adjust the second bias signal until a signal propagation delay through the second delay line matches a second phase offset.

9. The delay control circuit of claim 8 wherein the second phase offset corresponds to a phase difference between the first clock signal and a third clock signal output from one of the delay elements within the first delay line.

10. The delay control circuit of claim 1 further wherein the calibration circuitry comprises:
a first delay line having a predetermined number of series-coupled delay elements each implemented identically to the first delay element and imposing a respective signal propagation delay according to the first bias signal;
a second delay line having a predetermined number of series-coupled delay elements each implemented identically to the second delay element and imposing a respective signal propagation delay according to the second bias signal; and
bias adjustment circuitry to iteratively adjust the first bias signal and then iteratively adjust the second bias signal, including circuitry to:
iteratively adjust the first bias signal until a signal propagation delay through the first delay line matches a predetermined first phase offset between first and second reference signals, and
iteratively adjust the second bias signal until a signal propagation delay through the second delay line matches a second phase offset between the first reference signal and a third reference signal.

11. A method of operation within a delay control circuit having a plurality of series-coupled delay stages each coupled to receive a respective bit of a delay control value, the method comprising:
routing an input signal through a first one of the series-coupled delay stages via a first delay element if the respective bit of the delay control value is in a first state, the first delay element imposing a first signal propagation delay according to a first bias signal;
routing the input signal through the first one of the series-coupled delay stages via a second delay element instead of the first delay element if the respective bit of the first delay control value is in a second state, the second delay element imposing a second signal propagation delay according to a second bias signal; and
calibrating the first and second bias signals such that the second signal propagation delay exceeds the first signal propagation delay by a nonzero time interval that matches a predetermined delay interval substantially briefer than the first signal propagation delay.

12. The method of claim 11 wherein each of the first and second delay elements comprises a respective set of two inverters coupled in series, and wherein the time interval by which the second signal propagation delay exceeds the first signal propagation delay is less than a minimal time required for signal propagation through the two inverters coupled in series in either respective set.

13. The method of claim 11 further comprising:
routing the input signal through a second one of the series-coupled delay stages via a third delay element if the respective bit of the delay control value received by the second one of the series-coupled delay stages is in a first state, the third delay element imposing the first signal propagation delay according to the first bias signal; and
routing the input signal through the second one of the series-coupled delay stages via an alternative signal propagation path that lacks a bias-controlled delay element instead of the first delay element if the respective bit of the delay control value received by the second one of the series-coupled delay stages is in a second state.

14. The method of claim 11 wherein the time interval by which the second signal propagation delay exceeds the first signal propagation delay is not more than half the first signal propagation delay.

15. The method of claim 11 wherein calibrating the first and second bias signals such that the time interval by which the second signal propagation delay exceeds the first signal propagation delay matches the predetermined delay interval comprises calibrating the first and second bias signals such that the time interval by which the second signal propagation delay exceeds the first signal propagation delay nominally matches the first signal propagation delay divided by $2^M$, where M is integer greater than or equal to one.

16. The method of claim 15 wherein calibrating the first and second bias signals such that the time interval by which the second signal propagation delay exceeds the first signal propagation delay nominally matches the first signal propagation delay divided by $2^M$ comprises iteratively adjusting the first bias signal until a signal propagation delay through a first delay line matches a first reference time interval, the first delay line having a predetermined number of series-coupled delay elements each implemented identically to the first delay element and imposing a respective signal propagation delay according to the first bias signal.

17. The method of claim 16 wherein calibrating the first and second bias signals such that the time interval by which the second signal propagation delay exceeds the first signal propagation delay nominally matches the first signal propagation delay divided by $2^M$ further comprises iteratively adjusting the second bias signal until a signal propagation delay through a second delay line matches a second reference time interval, the second delay line having a predetermined number of series-coupled delay elements each implemented identically to the second delay element and imposing a respective signal propagation delay according to the second bias signal.

18. The method of claim 17 wherein the first reference time interval corresponds to a predetermined phase offset between first and second clock signals.

19. The method of claim 18 wherein the second reference time interval corresponds to a phase difference between the first clock signal and a third clock signal output from one of the delay elements within the first delay line.

20. A delay control circuit comprising:
a plurality of delay stages coupled in series and each coupled to receive a respective bit of a delay control value;
means for routing an input signal through one of the series-coupled delay stages via a first delay element if the respective bit of the delay control value is in a first state, the first delay element imposing a first signal propagation delay according to a first bias signal;
means for routing the input signal through the one of the series-coupled delay stages via a second delay element instead of the first delay element if the respective bit of the delay control value is in a second state, the second delay element imposing a second signal propagation delay according to a second bias signal;
means for calibrating the first and second bias signals such that the second signal propagation delay exceeds the first signal propagation delay by a nonzero time interval that matches a predetermined delay interval substantially briefer than the first signal propagation delay.

\* \* \* \* \*